United States Patent [19]
Arai et al.

[11] Patent Number: 5,078,558
[45] Date of Patent: Jan. 7, 1992

[54] LOW MASS SPINDLE AND Z-AXIS UNIT

[75] Inventors: Kunio Arai, Atsugi; Yasuhiko Kanaya, Machida, both of Japan

[73] Assignee: Hitachi Seiko, Ltd., Kanagawa, Japan

[21] Appl. No.: 480,940

[22] Filed: Feb. 16, 1990

[51] Int. Cl.$^5$ .............................................. B23Q 3/12
[52] U.S. Cl. .................................... 409/233; 384/107; 408/239 R
[58] Field of Search ............... 409/231, 232, 233, 234; 384/107, 100; 408/239 R, 239 A, 238; 279/41 R, 46 R, 51, 58, 8

[56] References Cited

U.S. PATENT DOCUMENTS

| | | | |
|---|---|---|---|
| 4,640,653 | 2/1987 | Schartzman | 409/233 |
| 4,682,920 | 7/1987 | Rodgers | 409/231 |
| 4,708,547 | 11/1987 | Baron | 409/233 |
| 4,790,700 | 12/1988 | Schwartzman | 409/23 |
| 4,828,403 | 5/1989 | Schwartzman | 384/107 X |
| 4,836,692 | 6/1989 | Hagen | 387/107 |
| 4,869,626 | 9/1989 | Kosmowski | 409/231 |

FOREIGN PATENT DOCUMENTS

| | | | |
|---|---|---|---|
| 2900363 | 7/1980 | Fed. Rep. of Germany | 384/107 |
| 196141 | 11/1984 | Japan | 409/231 |
| 508599 | 5/1976 | U.S.S.R. | 384/107 |

*Primary Examiner*—William Briggs
*Attorney, Agent, or Firm*—Antonelli, Terry, Stout & Kraus

[57] ABSTRACT

A spindle and Z-axis unit comprises a spindle housing and a hollow rotor shaft rotatable and axially movable with respect to the spindle housing. The rotor shaft carries a collet at its lower end for chucking a machine tool such as a drill bit. The tool is changed in the collet by pneumatic actuation of a diaphragm which actuates a push rod within the rotor shaft to move the collect axially against a spring bias to clamp and unclamp the tool. The shaft is moved in the Z-direction along with a thrust bearing assembly by a screw nut which actuates a road to move the rotor shaft in the Z-direction to drill a workpiece after a pressure foot has first been moved to clamp the workpiece with respect to the spindle. Thus, the moving weight or mass previously attributable to parts such as a spindle saddle and spindle housing can be eliminated without impairing the reliability and chucking force of the collet mechanism.

12 Claims, 14 Drawing Sheets

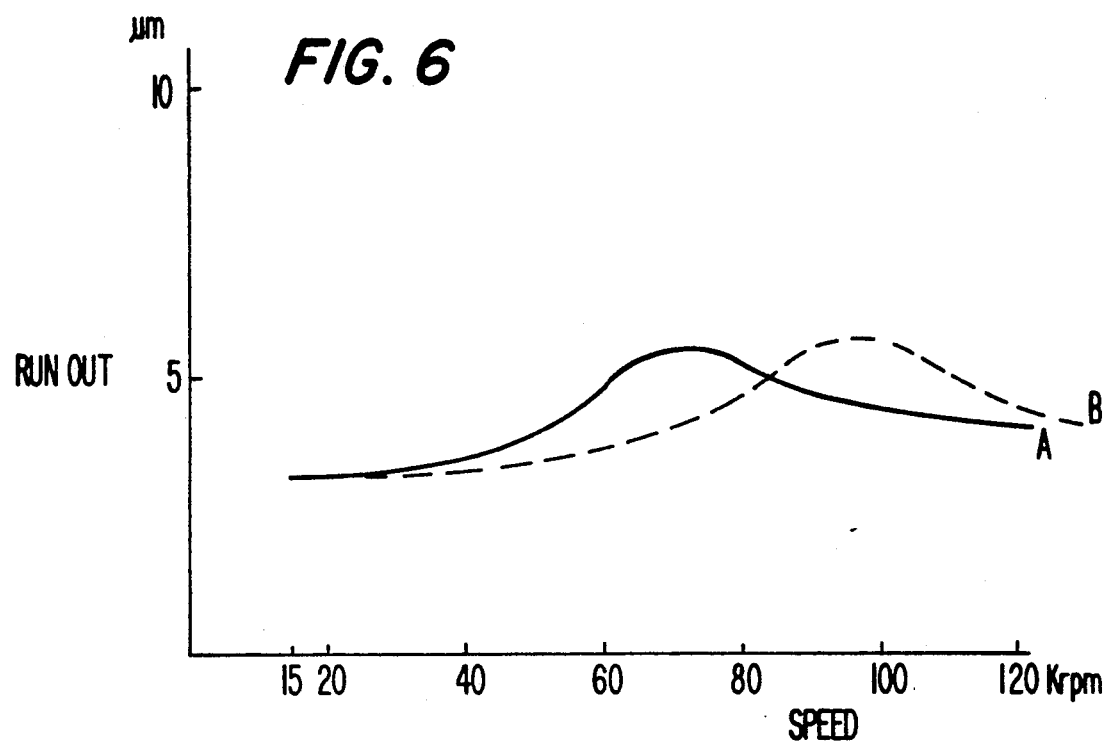
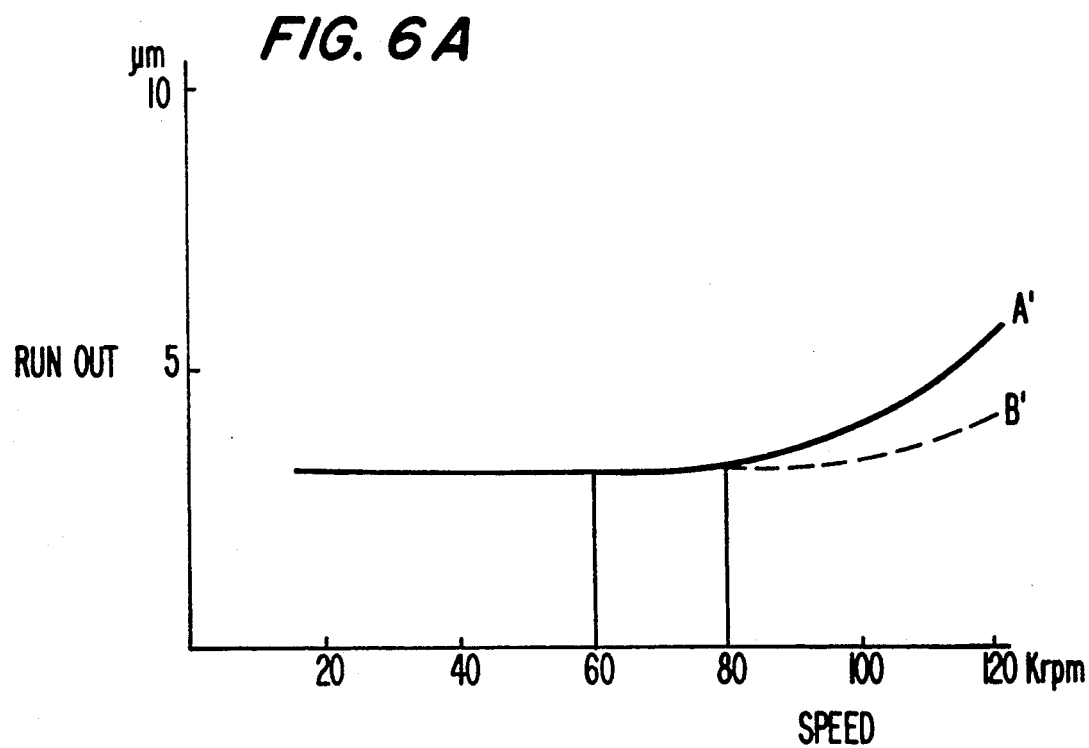

LOW MASS SPINDLE AND Z-AXIS UNIT

BACKGROUND OF THE INVENTION

This invention relates to improvements in a spindle and Z-axis unit for drilling machines and, more particularly, to a spindle unit whose moving weight or mass is substantially reduced to minimize driving power and noise while, at the same time, permitting the drilling of larger diameter, high quality holes and increasing acceleration control.

FIG. 1 shows a conventional spindle unit designated generally by the numeral 14 widely used for drilling machines which drill holes in printed circuit boards (PCBs). A hollow rotor shaft 101 includes a built-in copper core 110, a thrust flange 103, and a tapered collet 24 for chucking a drill bit 25. The rotor shaft 101 is supported by a radial air bearing 102 and by an axial thrust air bearing 105 located inside of spindle body or housing 104. A selectively energized motor coil 106 surrounding the core 110 drives the rotor shaft 101 for a drilling operation. An arrow 111 shows a direction of a supply of air to the air bearings 102,105 through an inlet port on the side of a diaphragm body at the top of the spindle housing 104. The direction of an air supply for a collet actuating diaphragm 107 mounted in a cavity in the diaphragm body 108 is designated by arrow 112. In an automatic tool change (ATC) process, the diaphragm 107 when actuated by the air supply in direction 112 pushes the collet 24 downwardly axially relative to the rotor shaft 101 in the direction of arrow 113 via a push rod 114 located concentrically within the rotor shaft 101. This downward movement opens the jaws of the collet 24 to allow an ATC operation for the drill bit 25.

FIG. 2 and FIG. 3 show a conventional spindle of the type shown in FIG. 1 mounted on a conventional Z-axis unit. A drive motor 7 is mounted on a unit base 6 to drive a screw shaft 11 supported by ball bearings 9 also located on the unit base 6. Screw shaft 11 drives a screw nut 12 to which a spindle saddle 13 is mounted for movement in an axial direction (the Z-axis) of the spindle 14. The spindle saddle 13 can be supported and guided by a known linear guide mechanism. The spindle saddle 13 has the conventional spindle unit 14 fitted therein and reciprocates the spindle unit 14 in the Z-axis direction, and also reciprocates an axially movable pressure foot 20 with a chip evacuation system 39 supported, axially guided and moved 15 by brackets 15 mounted on the spindle saddle 13, a pair of air cylinders 16, swivel joints 17, and shafts 19 supported by bearings 18 located at both sides of the spindle unit 14.

In the typical drilling process, the spindle saddle 13 is caused to move downwardly by actuation of the screw nut 12, and the pressure foot 20 first contacts a surface of a PCB 22 to be drilled. The pressure foot 20 clamps the PCB 22 by an actuation force of the air cylinders 16. The spindle unit 14 is then advanced in the Z-direction through an opening in the pressure foot 20 and drills the PCB 22 via the drill bit 25 which is rotated when the motor coil 106 is energized to rotate the rotor shaft 101. As soon as the tip of the drill bit 25 reaches a specified depth (the down limit), the pressure foot 20 and the spindle saddle 13 retract to a resting position (the up limit), and a tooling table 21 upon which the PCB 22 is secured and a spindle carriage (not shown) move to the next drilling position to repeat the pressure foot clamping and drilling process.

In the above described Z-axis unit, the total weight of the various moving parts exceeds 15 kg. Most of the weight is attributable to the spindle saddle 13 and the spindle body 104. Accordingly, high acceleration control which is necessary for high speed positioning cannot be attained satisfactorily and undesired noise is produced by excessive G forces. Reductions in the size of the drive motor and other spindle mechanisms have not been achievable up to now as a result.

FIG. 4 shows another conventional form of spindle unit designated generally by the numeral 14' which uses a centrifugal collet 115 at the end of a rotor shaft 101' instead of a diaphragm and tapered collet of the type shown in FIG. 1 to reduce the moving weight of the unit for higher acceleration control and noise reduction. Parts similar to those shown in FIG. 1 are designated with the same numerals but are primed. The rotor shaft 101' includes a built-in copper core 110' which is slightly longer than the core 110 shown in FIG. 1 for permitting axial movement. Radial air bearings 102' are provided along the axial length of the rotor shaft 101', and a thrust flange 103' is integral with the rotor shaft 101'. A thrust air bearing 105' in a thrust bearing assembly 38 at the top of the unit 14' supports the flange 103'. A selectively energized motor coil 106' surrounds the core 110'. A supply of pressurized air is provided to the radial bearings 102' in the direction shown by arrow 111' through a port (unnumbered) in the spindle housing or body 104'. Unlike the spindle unit 14 in FIG. 1, however, the thrust air bearing assembly 38 in the spindle unit 14' of FIG. 4 is supported and guided in the axial or Z-axis direction by a special radial air bearing 117' and an air groove 118' located on the radial periphery of the thrust bearing assembly 38 instead of through a relatively massive spindle saddle and the spindle housing. An arrow 116' shows the direction of a supply of air for the thrust air bearing 105' through a port in the assembly 38. A rod 32 fixedly mounted on the thrust bearing assembly 38 moves the drill bit 25 in the axial or Z-direction designated by double-headed arrow 119 via the thrust air bearing assembly 38, the rotor shaft 101' and the centrifugal collet 115'. With such an arrangement, the moving weight of the spindle unit 14' is reduced to about 1.5 kg. However the centrifugal collet 115' in this form of spindle has a chucking or clamping force which is unacceptably small at low speed ranges from about 15 to 30 Krmp. It is necessary in order to achieve high hole quality (i.e. no roughness, no smearing) for drilling hole sizes of 0.08" to 0.25" to maintain an adequate chucking force at the low speed range. As a result, although the total moving weight of the spindle unit 14' can be decreased with a centrifugal collet 115' of the aforementioned type so as to increase acceleration control and reduce noise, drill bit sizes are limited to 0.08" or lower to ensure adequate chucking force.

FIG. 4E shows details of the centrifugal collet mechanism used in the spindle shown in FIG. 4. In particular, a front end of a rotor 101' is supported in radial air bearing 102' so as to rotate around the same axis as the spindle body 104'. A depression 3a is formed in the shaft 101' and is open toward the front of the rotor with a suitable depth in the axial direction. A guide portion 6a provided with a central fitting hole 5a to which a tool 25 fits is inserted into the interior of the depression 3a. At the bottom of the depression 3a, a cylindrical guide portion 8a having a central fitting hole in which the tool 25 fits is inserted so as to extend axially. The guide portion 6a with the central fitting hole 5a, the cylindrical guide portion 8a and the central bottom hole 7a formed on the bottom of the rotor 101' are adapted to be concentrically fitted with an allowable clearance of several microns.

A centrifugal piece 13a provided with a fitting hole 12a to which the guide portion 8a is applied or fitted and another fitting hole 9a through which the tool 25 is inserted is situated in the hole 3a with predetermined clearances or gaps 10a and 11a to the inner surface of the depression 3a and an outer surface of the tool 25. The centrifugal piece 13a is statically held within the depression 3a so as to keep the predetermined clearance 10a and 11a by means of an O-ring 14a situated as shown around the guide portion 8a. The fitting hole 9a of the centrifugal piece 13a through which the tool 25 is inserted is designed to have substantially the same fitting allowance as that of the central fitting hole 5a and the central bottom hole 7a. The tool 25 is prevented from dropping out of these holes 5a, 7a and 9a when it is static or stable by means of another O-ring 15a fitted around the cylindrical body of the tool 25.

When the rotor 101' rotates during a drilling operation of the spindle, the centrifugal piece 13a eccentrically rotates together with the rotary motion of the rotor 101' resulting in transformation of the rotary center of gravity due to eccentric rotation. As a result, a centrifugal force is generated in the cylindrical guide portion 8a and the tool 25, and a torque or a force couple is generated, so that the tool 25 is firmly held in place by a reaction force of the fitting faces of the fitting holes 5a and 7a, and friction coefficients of the fitting faces. Consequently, when the rotor shaft rotates at a speed less than 30 Krpm, it is difficult to obtain sufficient centrifugal force of the tool because the collet slips on the tool holding surface.

SUMMARY OF THE INVENTION

An object of the present invention is to provide a spindle and Z-axis unit which overcomes the problems and disadvantages encountered in conventional units.

More specifically, it is an object of the present invention to provide a spindle constructed in such a manner whereby the weight or mass of the moving spindle parts is reduced and the reliability of the collet mechanism at low speed ranges is increased.

Yet another object of the present invention is to improve dimensional drilling accuracy and thus productivity while, at the same time, permitting the range of drill hole sizes to be increased so as to extend from 0.004" to 0.25" in diameter and to provide an all-round drill bit range.

A still further object achieved with the present invention is the reduction of power needed for the spindle drive motor which has the consequent advantage of minimizing maintenance, improving reliability of the mechanisms and increasing cost performance.

The foregoing objects have been achieved in a spindle unit constructed in accordance with the present invention such that a stationary spindle housing is provided which does not require the use of a relatively massive, movable spindle saddle and which avoids a centrifugal collet having low chucking forces in a low speed range. More particularly, a hollow rotor shaft with a built-in copper core is arranged within the spindle housing and is provided with a thrust flange which is supported on a thrust bearing assembly via an axial air thrust bearing. The shaft is supported with respect to the housing via spaced radial air bearings and is movable axially relative to the shaft along with the thrust bearing assembly. A motor coil surrounds the built-in core on the rotor shaft and is selectively energized to rotate the shaft during a hole drilling operation. A pneumatically actuated diaphragm arranged within the thrust bearing assembly is actuated to move a push rod axially within the rotor shaft to engage the taper collet and disengage the tool during a tool changing operation, after which the push rod is disengaged and the collet is spring biased back to its tool engaging position within the shaft to chuck the tool with sufficient force.

BRIEF DESCRIPTION OF THE DRAWINGS

These and other features, objects and advantages of the present invention will become more readily understood from the following detailed description of presently preferred embodiments when taken in conjunction with the accompanying drawings wherein:

FIG. 6 is a graph showing the supercritical run-out characteristics of high speed spindles;

FIG. 6A is a graph showing the sub-critical run-out characteristics of high speed spindles;

DESCRIPTION OF PREFERRED EMBODIMENTS

Figure 1:
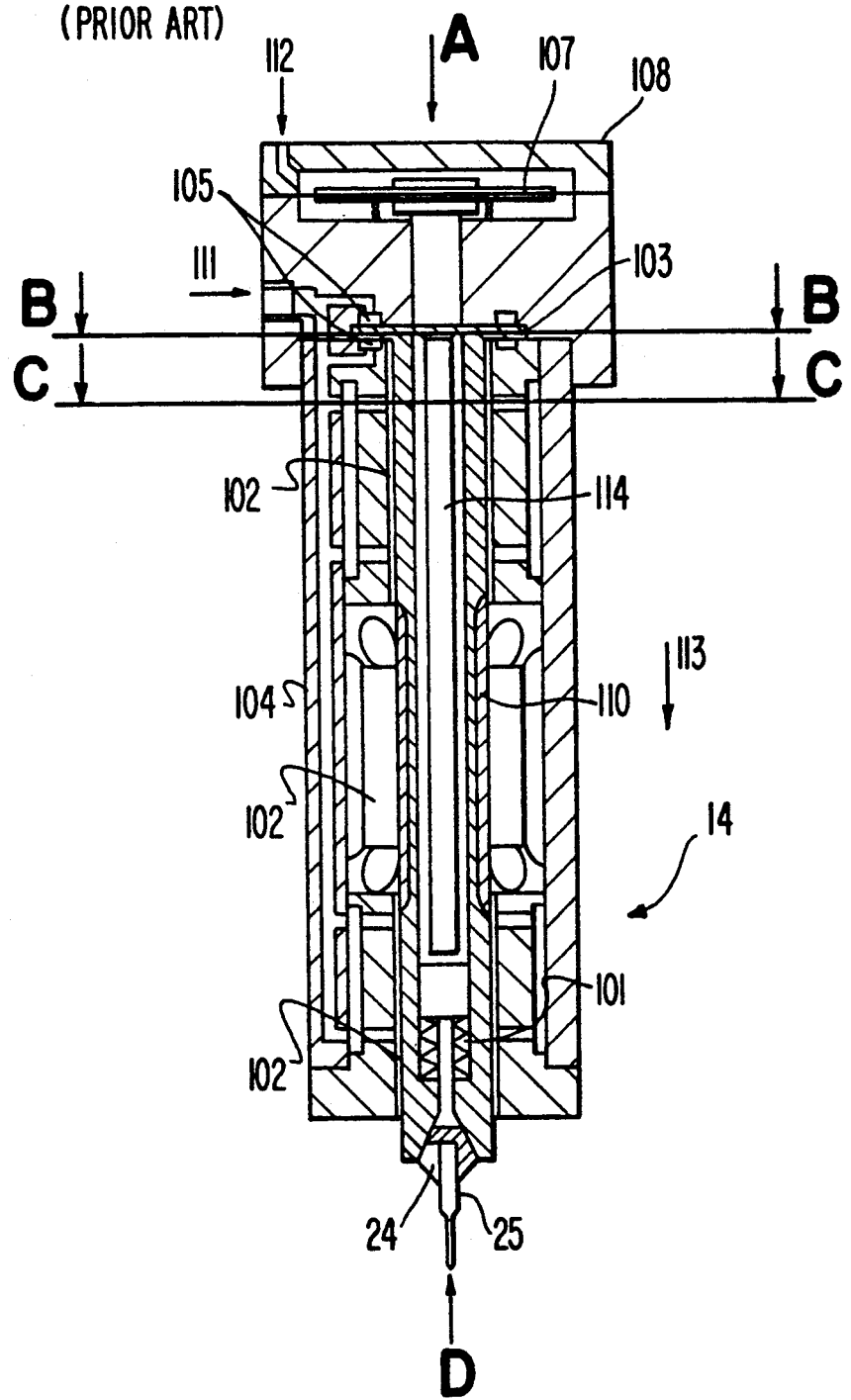
FIG. 1 is a cross-sectional elevation view of the above discussed conventional diaphragm-type spindle unit.
Figure 1A:
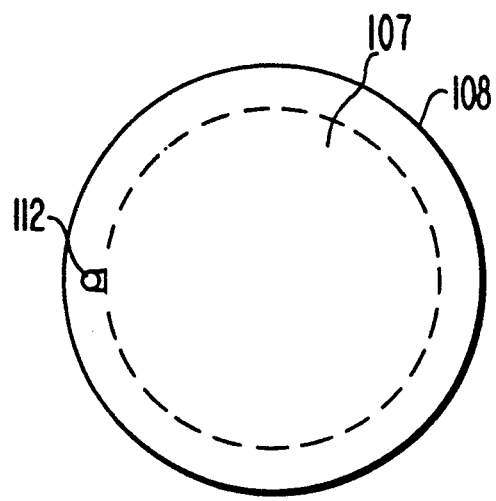
FIG. 1A is a top plan view of the unit shown in FIG. 1.
Figure 1B:
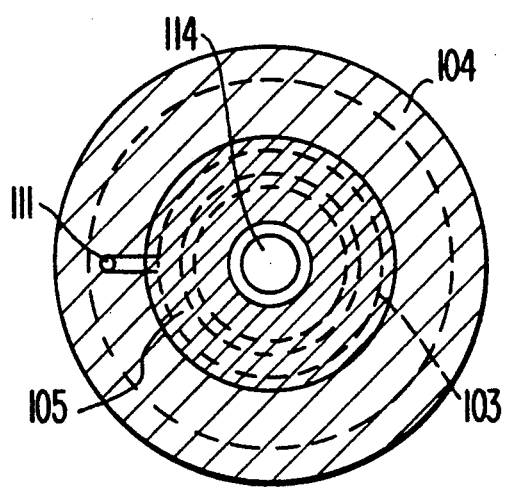
FIG. 1B is a sectional view taken along line B—B of FIG. 1.
Figure 1C:
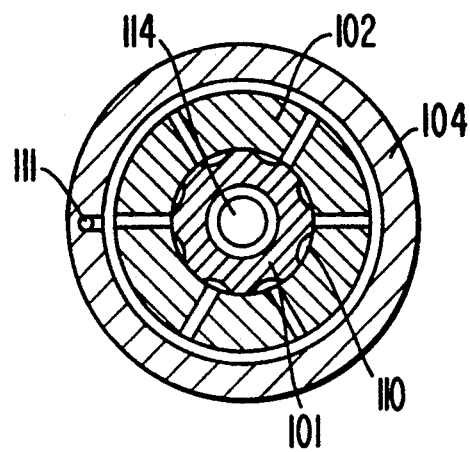
FIG. 1C is a sectional view taken along line C—C of FIG. 1.
Figure 1D:
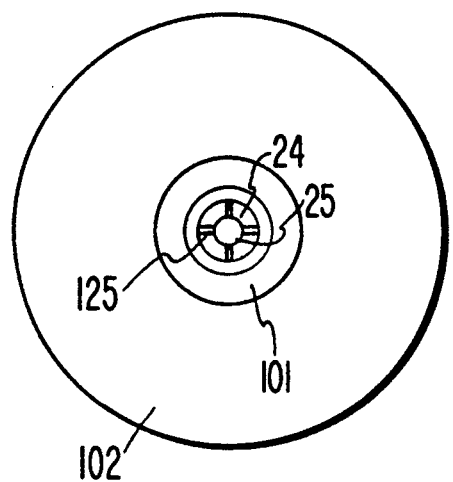
FIG. 1D is a bottom plan view of the unit shown in FIG. 1.
Figure 7D:
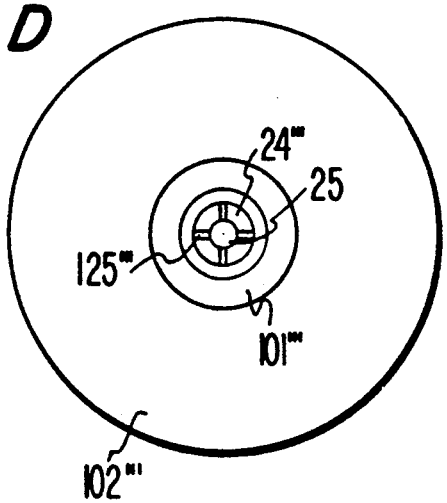
FIG. 7D is a bottom plan view of the unit shown in FIG. 7.
Figure 2:
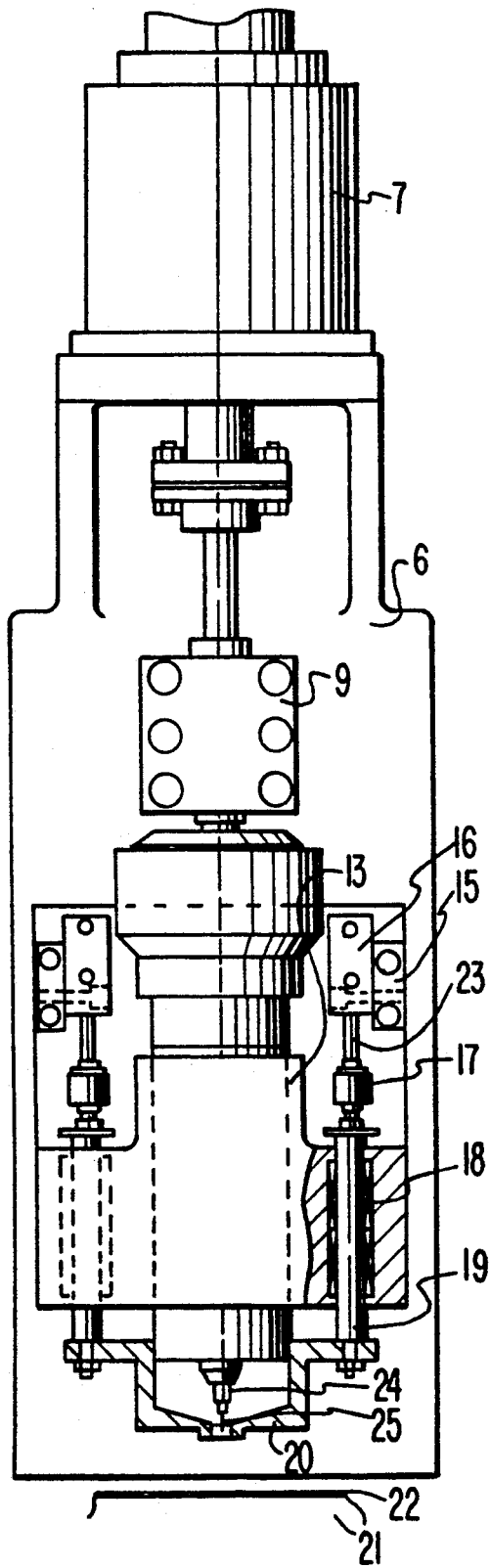
FIG. 2 is an elevational view, partially in cross-section, of the above discussed conventional Z-axis unit for the spindle of FIG. 1.
Figure 3:
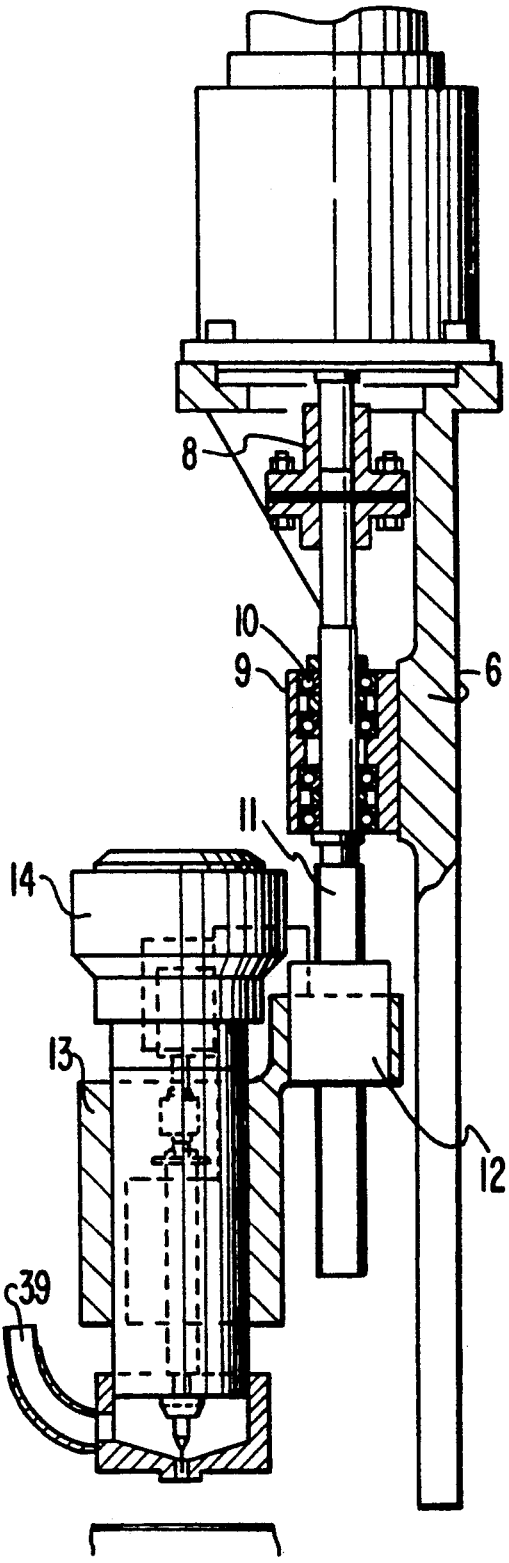
FIG. 3 is a side view, partially in cross-section of the conventional Z-axis unit of FIG. 2.
Figure 4:
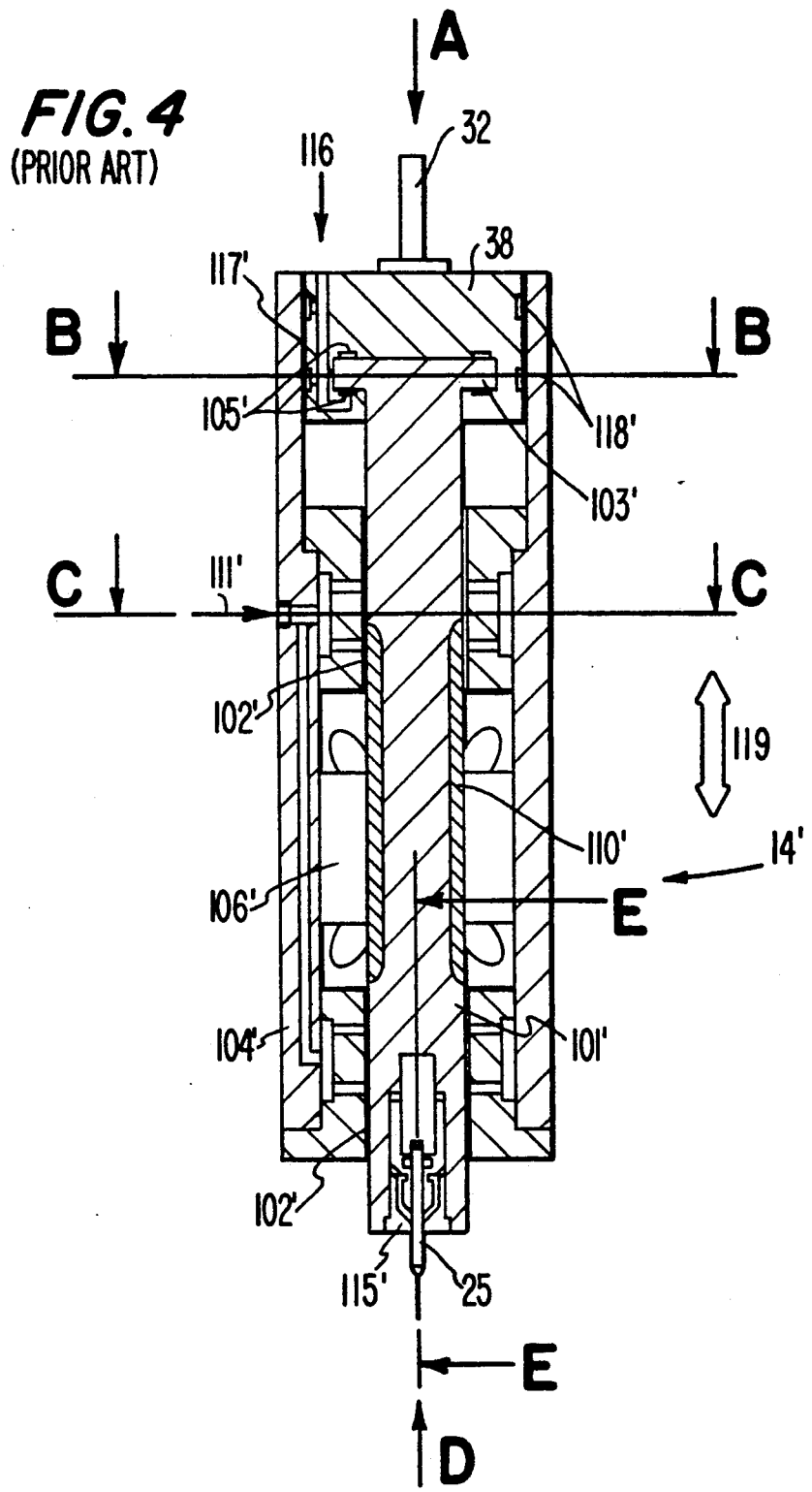
FIG. 4 is a cross-sectional elevation view of the above discussed conventional centrifugal collet spindle unit.
Figure 4A:
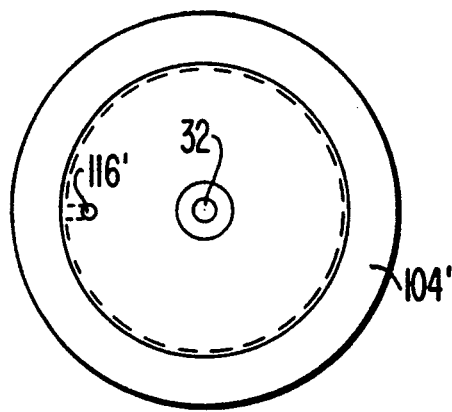
FIG. 4A is a top plan view of the unit shown in FIG. 4.
Figure 4B:
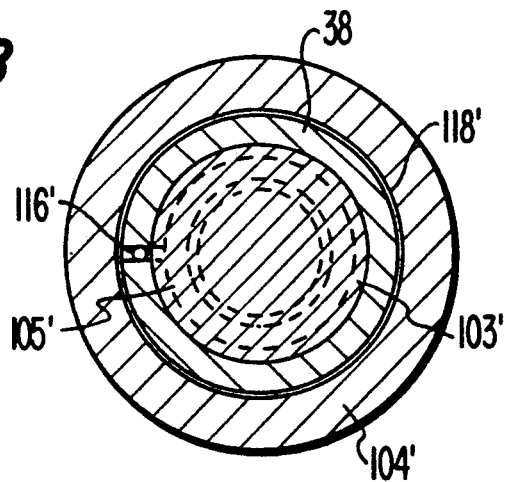
FIG. 4B is a sectional view taken on line B—B in FIG. 4.
Figure 4C:
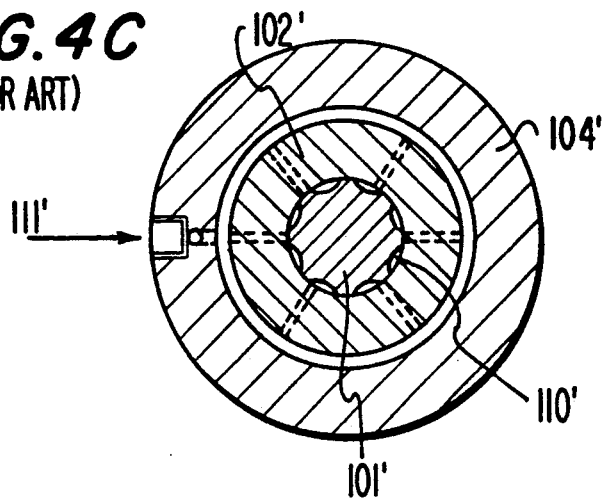
FIG. 4C is a sectional view taken on line C—C in FIG. 4.
Figure 4E:
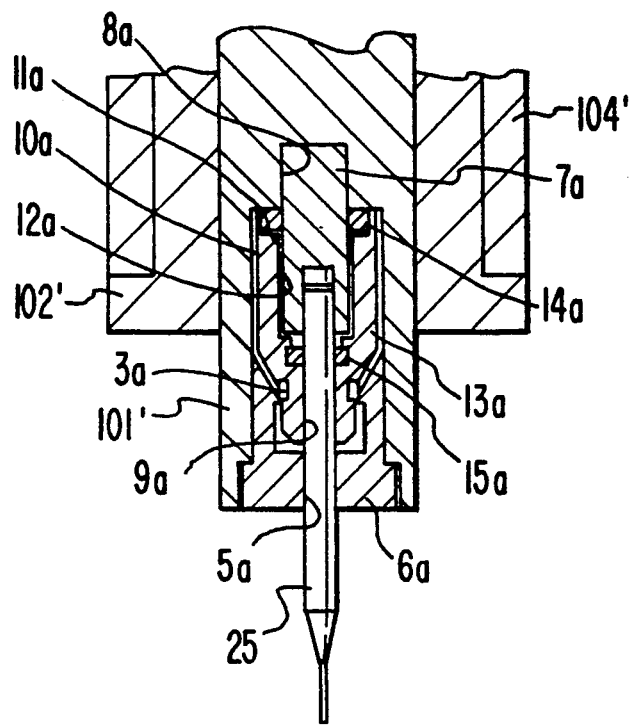
FIG. 4E is a fragmentary longitudinal section on line E—E of FIG. 4.
Figure 4D:
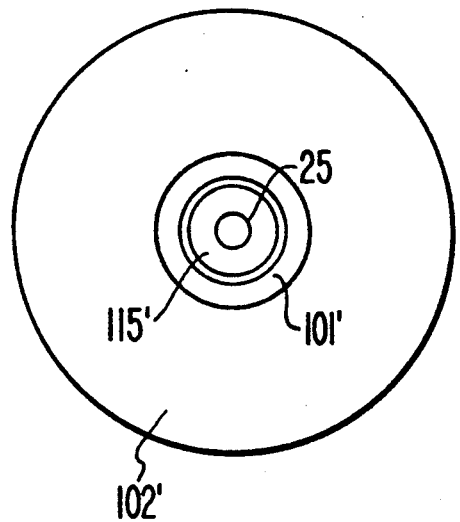
FIG. 4D is a bottom plan view of the unit shown in FIG. 4.
Figure 5:
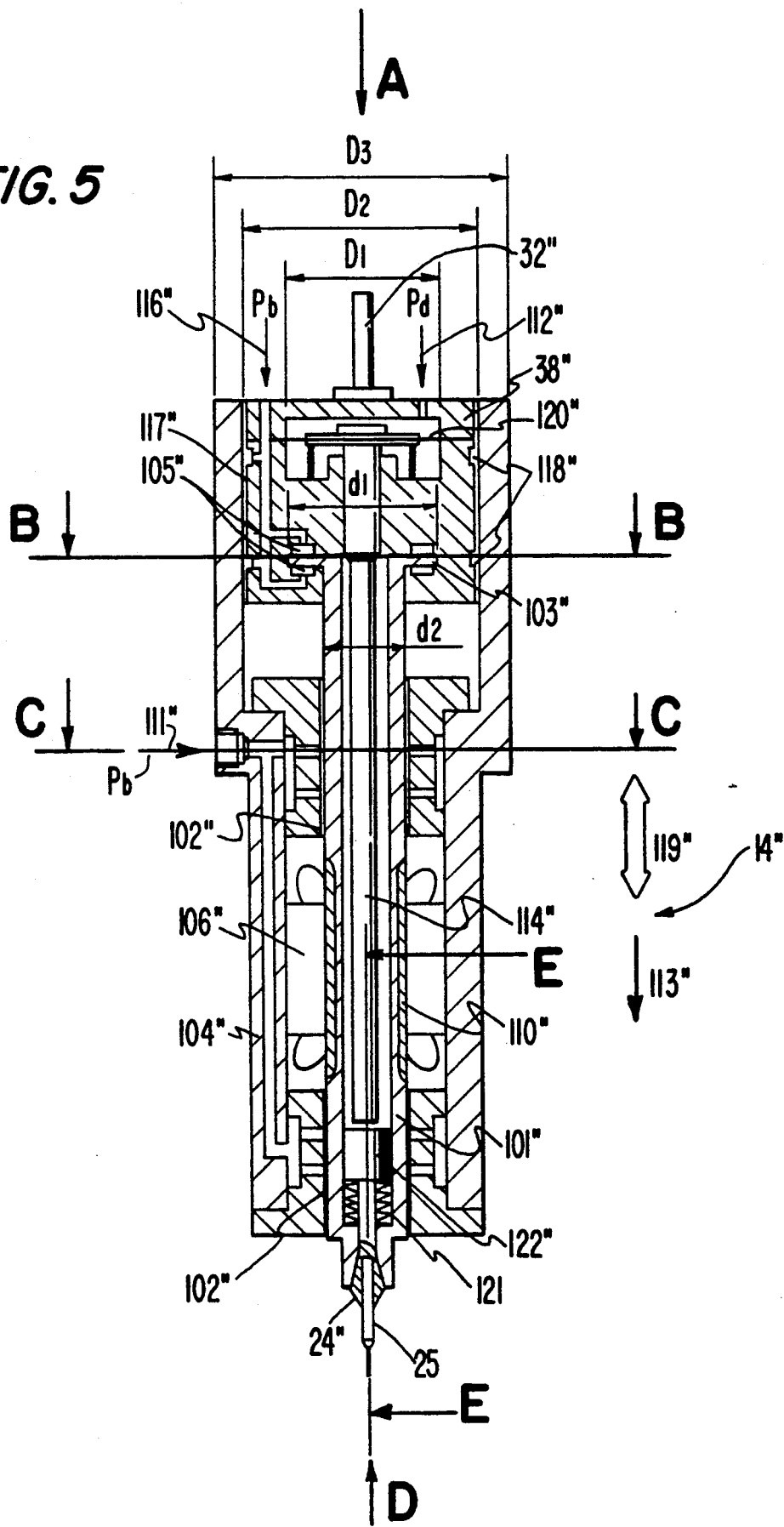
FIG. 5 is a cross-sectional elevation view of one embodiment of a spindle unit constructed according to the present invention.
Figure 5A:
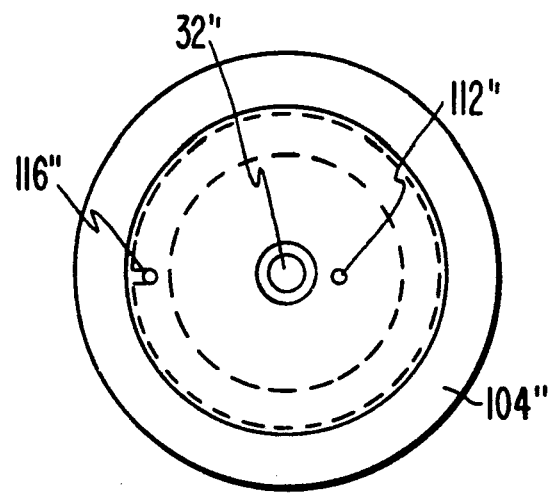
FIG. 5A is a top plan view of the unit shown in FIG. 5.
Figure 5B:
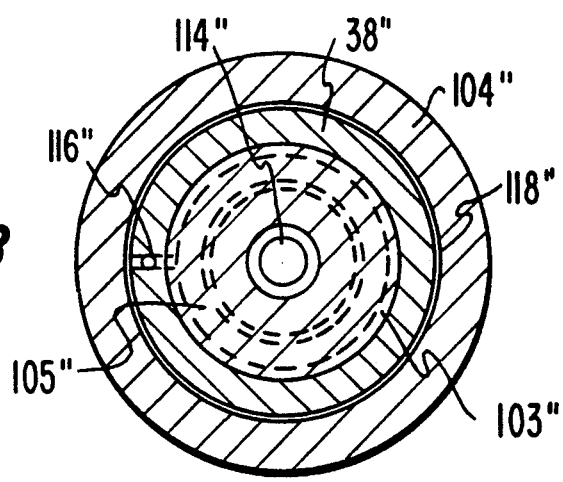
FIG. 5B is a sectional view taken on line B—B in FIG. 5.
Figure 5C:
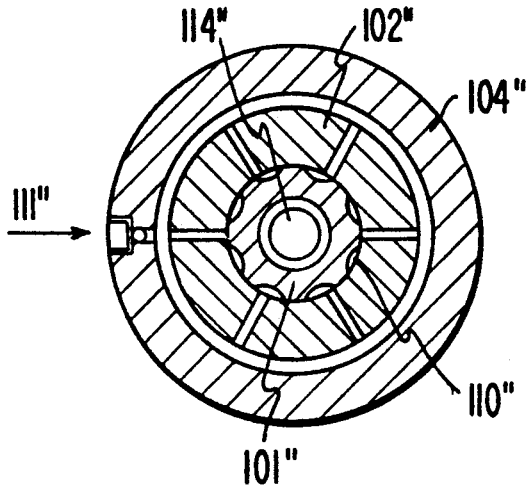
FIG. 5C is a sectional view taken on line C—C in FIG. 5.

Referring now to the drawings and, in particular, to FIG. 5, one embodiment of a spindle in accordance with the present invention is shown and designated generally by the numeral 14". Parts similar to those shown in FIGS. 1 and 4 are designated by the same numerals but with a double prime. In particular, this spindle unit 14" has a rotor shaft 101" with an outer diameter $d_2$ and a built-in copper core 110", and a thrust flange 103" with a diameter $d_1$ integral with and at the top of the shaft 101". Radial air bearings 102" are spaced axially along the rotor shaft 101". A thrust air bearing 105" arranged in the thrust bearing assembly 38" supports the flange 103". A selectively energized motor coil 106" surrounds the core 110". A supply of pressurized air to the radial air bearings 102" is provided through ports in the spindle housing 104" in the direction shown by the arrow 111". The pressurized air is also supplied to the thrust bearing 105" through a port in the assembly 38" as shown by the arrow 116". Air is supplied to the bearings 102",105" at pressure $P_b$ and also to air bearing 117" on the outer peripheral face of the assembly 38" through radial air grooves 118" arranged in the assembly 38" whose diameter is $D_2$. The spindle housing at the upper end has a diameter $D_3$. A rod 32" mounted on the assembly 38" is actuated in the axial direction by a Z-axis unit (FIGS. 8 and 9) and moves the drill bit 25 in an axial or Z-axis direction shown by double-headed arrow 119" by the above described air bearing system.

A spring-biased diaphragm 120" similar to but of smaller diameter $D_1$ than diaphragm 107 in FIG. 1 is provided in a cavity of the thrust bearing assembly 38" and is supplied with pressurized air at pressure $P_d$ through a port in the direction indicated by the arrow 112". During an ATC process, collet-actuating air at the pressure $P_d$ is supplied through the port in the assembly 38" to the a diaphragm 120" which is connected with a push rod 114" to push a stopper 122" normally biased upward by a disk spring 121 in the downward direction indicated by arrow 113" and thereby open the taper collet 24" which is normally spring biased toward a chucking position within the shaft 101" to allow changing of the drill bit 25". The air supply pressure $P_b$ for each bearing 102",105" is approximately 4.8 to 5.0 kg/cm², and the air supply pressure $P_d$ for the collet actuation diaphragm 120" is approximately 5.5 to 6.0 kg/cm².

Figure 5E:
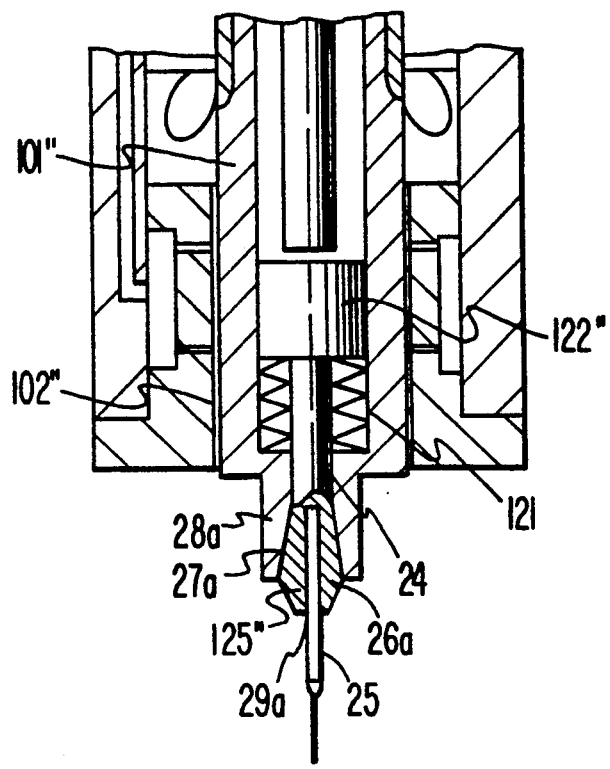
FIG. 5E is a fragmentary longitudinal section on line E—E in FIG. 5.
Figure 5D:
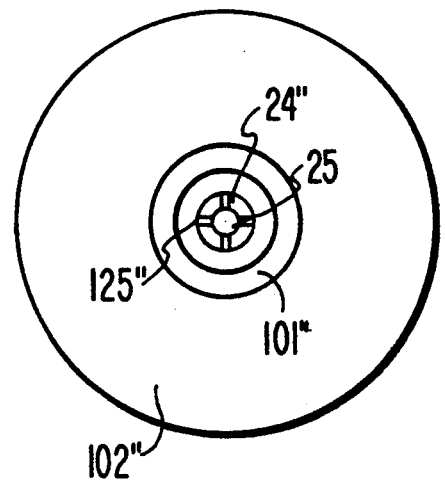
FIG. 5D is a bottom plan view of the unit shown in FIG. 5.

FIG. 5E shows details of the tapered collet mechanism used in the spindle depicted in FIG. 5. The main body of the rotor shaft 101' has a cylindrical shape and a clamp or grip portion 28a provided with a tapered hole 27a opening forwardly. The grip portion 28a is placed at the front end of the cylindrical rotor 101" so as to extend outwardly. The tapered hole 27a is concentric with the rotor 101" and communicated with the interior of the rotor 101". The collet 24" is inserted into the tapered hole 27a formed in the clamp portion 28a in a manner to allow removal from the inserted position. The collet 29a has a tool holding portion 26a placed in the tapered hole 27a at the front end of the chuck so as to hold the tool 25 and an expanded portion or stopper 122" at its rear end adapted so as to movably fit in the rotor 101". The tool holding portion 26a has a through-hole 29a opening to the front end of the holding portion 26a, through which the tool 25 is inserted. The tool holding portion 26a has a cylindrical shape and an axial slit 125" formed on the outer circumference of the portion 26a. When the collet 24" moves toward the rear end of the spindle mechanism, the tapered hole 27a of the grip portion 28a gradually becomes smaller, and consequently the tool holding portion 26a is clamped or pressed inwardly to close the through hole 29a. When the collet 24" is moved toward the front end, the tool holding portion 26a is released from its clamped condition due to the tapered hole 27a opening outwardly. The disk spring 121 is adapted to be placed in the space between the expanded portion or stopper 122" formed at the rear end of the collet 24" and a stepped front end portion of the rotor 101" in order to urge or press the collet 24" rearwardly. The resilient force of the disk spring 121 normally presses or urges the collet 24" along the rearward axial direction, and the tool holding portion 26a is kept at its closed condition. When the collet 24" moves forwardly by means of a collet opening-and-closing mechanism against the resilient force of the spring 121, the tool holding portion 26a opens.

Accordingly, the moving weight or mass with the arrangement of FIG. 5 has been decreased from more than 15 kg to 2.8 kg. As a result, acceleration controls and noise reduction are greatly improved without any compromise in the drill bit sizes which can be used to obtain high quality holes. During the drilling process with the spindle unit 14" of FIG. 5, only the rotor shaft 101", the collet 24", the drill bit 25, the push rod 114", the diaphragm 120" and the assembly 38" are driven instead of the entire spindle unit as is the case with the unit 14 of FIG. 1 which also requires movement of a spindle saddle 13. As a result, the spindle moving weight or mass is decreased to 2.8 kg, and spindle saddle 13 of FIG. 1 can be eliminated.

Figure 7:
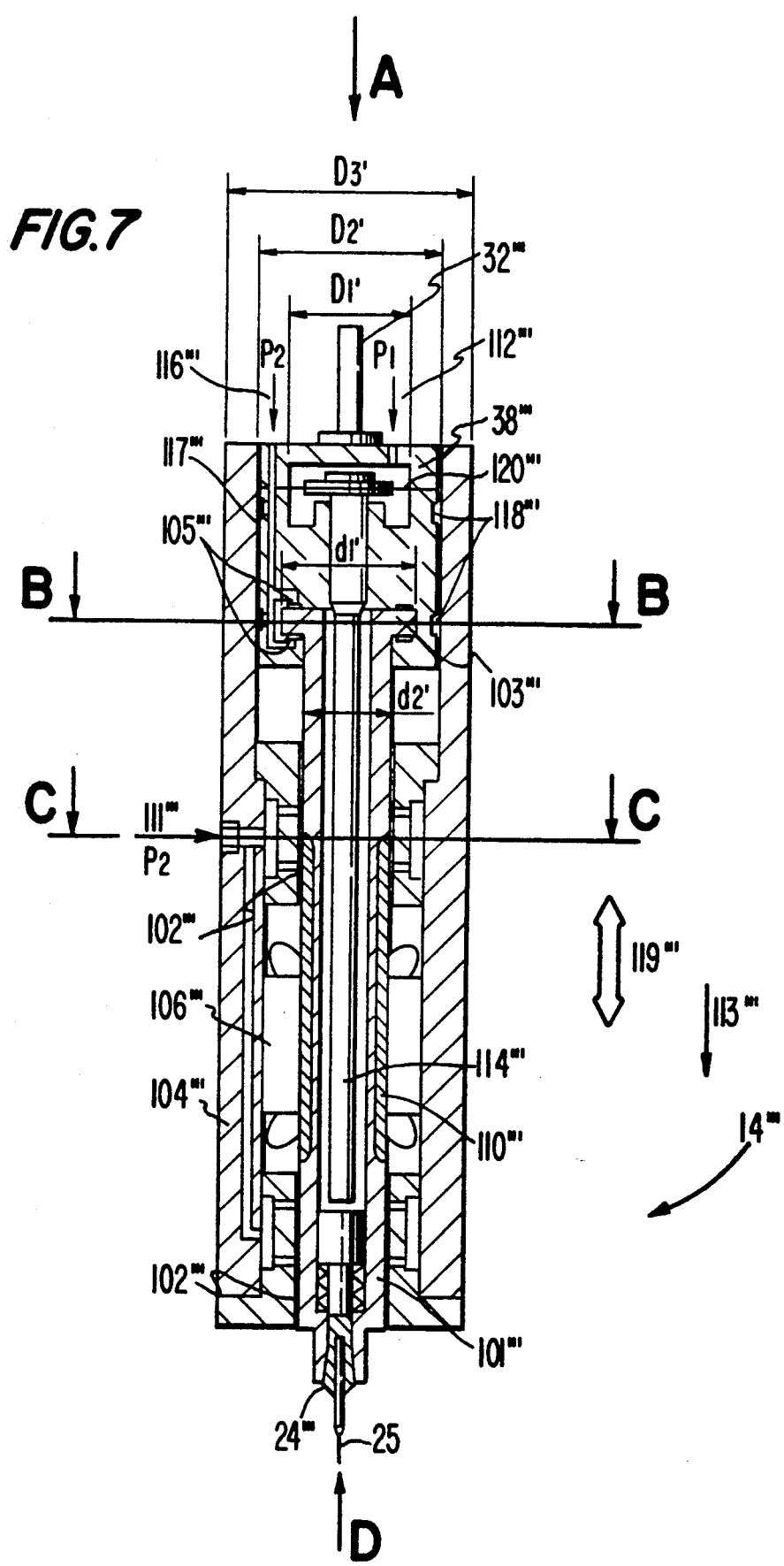
FIG. 7 is a cross-sectional elevation view of another embodiment of the spindle unit of the present invention.
Figure 7A:
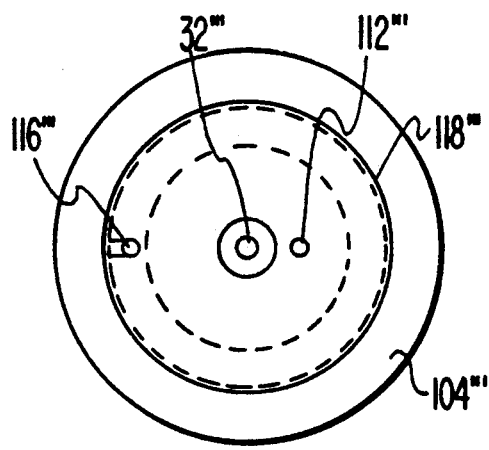
FIG. 7A is a top plan view of the unit shown in FIG. 7.
Figure 7B:
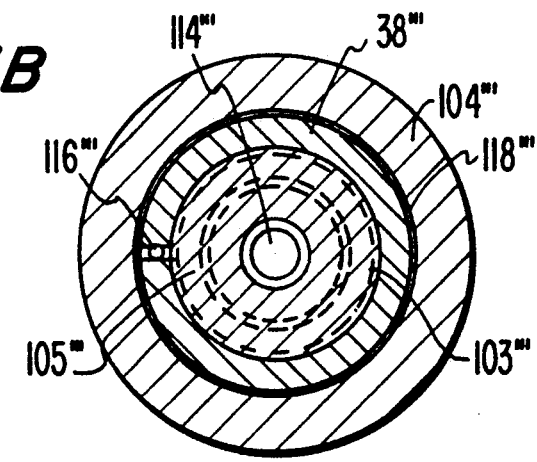
FIG. 7B is a sectional view on line B—B in FIG. 7.
Figure 7C:
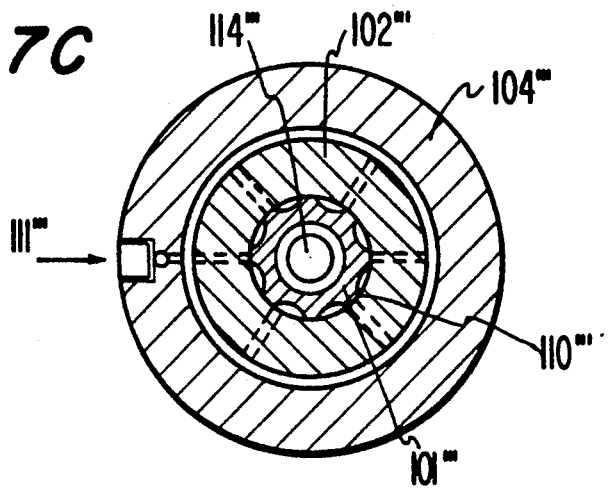
FIG. 7C is a sectional view on line C—C in FIG. 7.

FIG. 7 shows another embodiment of the spindle unit in accordance with the present invention which is substantially the same as the embodiment of FIG. 5 but which has a smaller upper portion to further reduce the moving mass. Parts similar in construction and operation to parts in FIG. 5 are designated by the same numerals but are triple primed and will not be further described except to the extent set forth hereinafter. The air supplied to the diaphragm 120''' is at pressure $P_1$, and the air supplied to the radial bearings 102''' and axial thrust bearings 105''' is at pressure $P_2$. The outer diameter of the rotor shaft 101''' is $d_2'$ and of the thrust flange 103 ''' is $d_1'$. The diaphragm 120''' has a diameter $D_1'$, the assembly 38''' has a diameter $D''$, and the upper portion of the spindle housing 104''' has a diameter $D_3'$.

Therefore, if $(d_1^2 - d_2^2) P_b = (d'_1{}^2 - d'_2{}^2) P_2$ [where $P_2$ is $5 \sim 10$ kg/cm²], and $D_1^2 P_d = D'_1{}^2 P_1$ [$P_1$ is $9 \sim 18$ kg/cm²], the flange diameter $d_1'$ is reduced to 75% of $d_1$, and the diaphragm diameter $D_1'$ is reduced to 70% of $D_1$. Accordingly, $D_2'$ and $D_3'$ are also reduced to near 70% of $D_2$ and $D_3$, and the moving weight is significantly reduced in the FIG. 7 embodiment from 2.8 kg to 2.0 kg. As a result, the overall dimensions of the spindle unit 14''' are substantially reduced or miniaturized.

Ordinary typical high speed spindles have two types of dynamic run-out characteristic as shown in FIGS. 6 and 6A. The dynamic run-out characteristic curves of FIG. 6 are known as the supercritical characteristic, i.e. the critical run-out point between minimum and maximum speed. FIG. 6A shows curves of another run-out characteristic known as the sub-critical characteristic, i.e. the critical run-out point over maximum speed. The characteristic curves shown by the solid lines A in FIGS. 6' and 6A are shifted rightwardly as shown by the dashed lines B as the pressure of the air supplied to the air bearings is increased.

For example, with regard to FIG. 6, the critical point for the supercritical characteristic shifts rightwardly from curve A to curve B. Thus, the supercritical run-out characteristic (measured in $\mu m$) is significantly improved in the speed range of 60 to 80 Krpm (thousand revolutions per minute) for small holes of from 4 to 40 mils and is only slightly worse in speeds between 80 to 120 Krpm. Futhermore, FIG. 6A shows that the sub-critical characteristic is also greatly improved in speed ranges at or above 80 Krpm so that the run-out reaches maximum only at much higher speeds than is the case with conventional spindles. At the same time, however, adequate collet actuation chucking force can be maintained for larger diameter drill bits.

Figure 8:
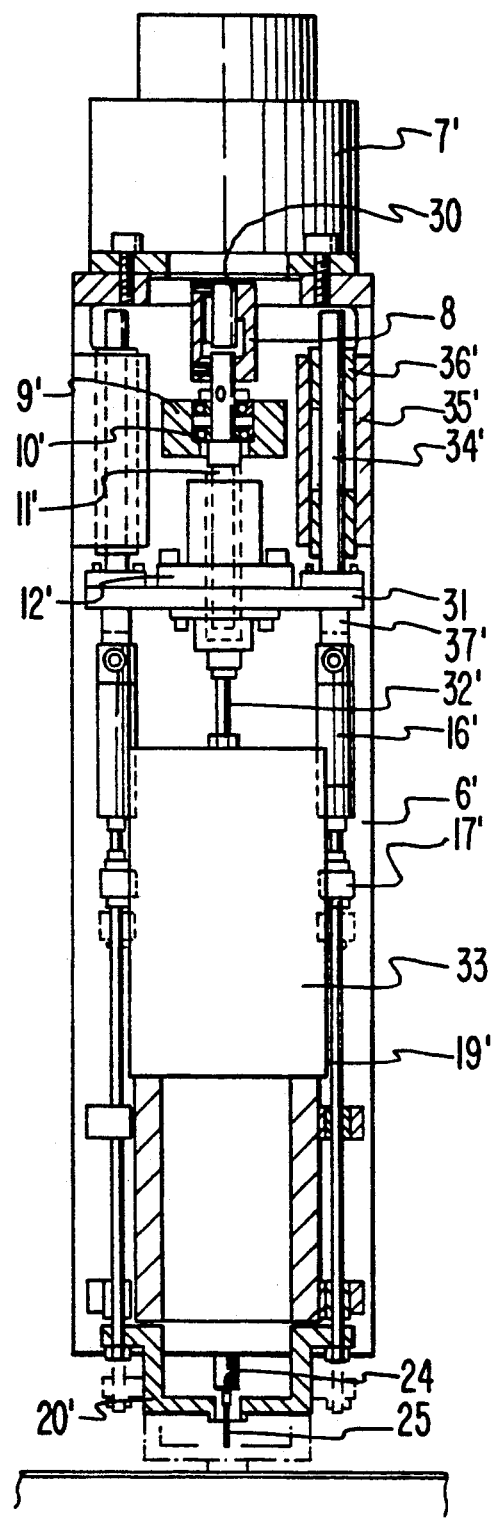
FIG. 8 is an elevational view, partially in cross-section of an improved Z-axis unit for the spindle of the present invention shown in FIGS. 5 and 7.
Figure 9:
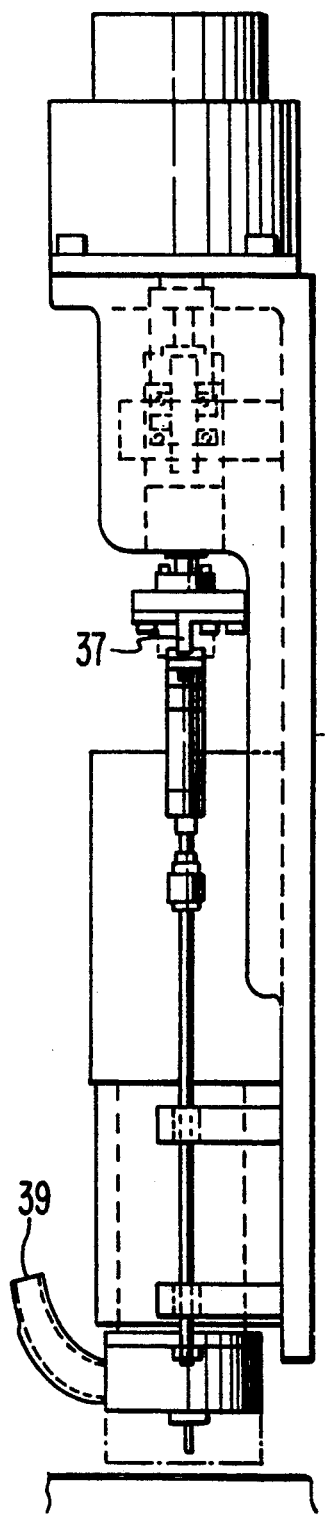
FIG. 9 is a side view of the Z-axis unit of FIG. 8.

FIGS. 8 and 9 show a presently preferred embodiment of the more compact Z-axis unit used for the spindles shown in FIGS. 5 and 7. More specifically, drive motor 7' is mounted on the unit base 6' and drives the screw shaft 11' supported by ball bearing 10' and the housing 9' which is also mounted on the unit base 6. The screw shaft 11' drives the screw nut 12' in the axial or Z-direction. The screw nut 12' is mounted on the plate 31' which is supported by a pair of guide shafts 34' arranged in a housing 35' and linear bearings 36'. Plate 31' reciprocates the radial air bearing-supported spindle rotor assembly, via the rod 32' in the axial or Z-direction comprising the rotor shaft, the collet, and diaphragm, including the thrust bearing assembly, described in FIGS. 5 and 7.

The plate 31' also drives the pressure foot 20' supported and guided by a pair of brackets 37', air cylinders 16', swivel joints 17', and shafts 19' located at both sides of the spindle unit 33 (of the type shown in FIGS. 5 and 7 as 14'' and 14''', respectively) in a manner similar to the conventional Z-axis units.

By virtue of the foregoing, the spindle saddle 13 and spindle body 4 which constitute a significant weight or mass are not driven. Consequently, these mechanisms exceed an acceleration of 2G's with the result that the feed/retract time for Z-axis movement can be substantially reduced. In addition, the drilling of holes between about 0.004" to 0.25" in diameter can now be achieved with this unit because the collet chucking force is maintained the same as in the conventional range of drill bit diameters.

While we have shown and described several embodiments in accordance with the present invention, it should be clearly understood that the same is susceptible of changes and modifications without departing from the scope of the invention. Therefore, it is not intended that the invention be limited to the details shown and described herein but that it should cover all such changes and modifications falling within the scope of the appended claims.

We claim:

1. A spindle unit comprising a housing, a rotor shaft mounted in the housing for movement therein in an axial direction of the shaft, means for moving the shaft in the axial direction relative to the housing, and a taper collet carried within a cavity formed in an end of the shaft and mounted for movement axially relative to said shaft for selectively engaging a tool with sufficient chucking force for a machining operation when said collet is engaged in said cavity and for disengaging the tool during a tool changing operation when said collet is displaced from said cavity due to axial movement thereof.

2. A spindle unit comprising a housing, a rotor shaft mounted in the housing and operatively arranged to move in an axial direction of the shaft, means for moving the shaft in the axial direction relative to the housing, and a taper collet operatively associated with the shaft so as to move axially relative thereto and selectively engage a tool with sufficient chucking force for a machining operation and to disengage the tool during a tool changing operation, and wherein one end of the rotor shaft is provided with a thrust flange, and a thrust bearing assembly is rotatably arranged with respect to the housing and contains thrust air bearings for supporting the thrust flange.

3. The spindle unit according to claim 1, wherein radial air bearings are located at axially spaced positions along the rotor shaft.

4. A spindle unit comprising a housing, a rotor shaft mounted in the housing and operatively arranged to move in an axial direction of the shaft, means for moving the shaft in the axial direction relative to the housing, and a taper collet operatively associated with the shaft so as to move axially relative thereto and selectively engage a tool with sufficient chucking force for a machining operation and to disengage the tool during a tool changing operation, radial air bearings located at axially spaced positions along the rotor shaft, and wherein one end of the rotor shaft is provided with a thrust flange, and a thrust bearing assembly is rotatably arranged with respect to the housing and contains thrust air bearings for supporting the thrust flange.

5. The spindle unit according to claim 2, wherein the thrust bearing assembly has a cavity with a diaphragm arranged therein adapted to be pneumatically actuated, and a push rod is associated with the diaphragm so as to cause the taper collet to move axially relative to the rotor shaft and to disengage the tool in response to pneumatic actuation of the diaphragm.

6. The spindle unit according to claim 5, wherein radial air bearings are located at axially spaced positions along the rotor shaft.

7. The spindle unit according to claim 2, wherein the rotor shaft is a hollow shaft, the taper collet has a portion slidable within the rotor shaft, and means are arranged between the portion and an end of the shaft for biasing the taper collet toward a position in which the collet engages the tool with sufficient chucking force to perform high quality machining operations over a wide speed range.

8. The spindle unit according to claim 7, wherein the thrust bearing assembly has a cavity with a diaphragm arranged therein adapted to be pneumatically actuated, and a push rod is associated with the diaphragm so as to cause the taper collet to move axially relative to the rotor shaft and to disengage the tool in response to pneumatic actuation of the diaphragm.

9. The spindle unit according to claim 8, wherein the portion of the taper collet is arranged to be actuated by the push rod to disengage the tool bit during the tool changing operation.

10. The spindle unit according to claim 3, wherein the rotor shaft has a built-in core approximately intermediate the radial air bearings, and motor windings are arranged in the housing in operative arrangement with the core for driving the rotor shaft when the windings are selectively energized.

11. The spindle unit according to claim 4, wherein the thrust bearing assembly has a cavity with a diaphragm arranged therein adapted to be pneumatically actuated, and a push rod is associated with the diaphragm so as to cause the taper collet to move axially relative to the rotor shaft and to disengage the tool in response to pneumatic actuation of the diaphragm.

12. The spindle unit according to claim 11, wherein the diaphragm, thrust flange and rotor shaft are sized in accordance with the air pressure supplied to the bearings and the diaphragm so as to permit reduction in the overall mass and improve the run-out characteristics of the spindle unit.

* * * * *